(12) United States Patent
Wang et al.

(10) Patent No.: US 9,190,532 B2
(45) Date of Patent: Nov. 17, 2015

(54) METHOD OF MAKING A SPLIT GATE NON-VOLATILE FLOATING GATE MEMORY CELL HAVING A SEPARATE ERASE GATE, AND A MEMORY CELL MADE THEREBY

(75) Inventors: Chunming Wang, Shanghai (CN); Baowei Qiao, Chengdu (CN); Zufa Zhang, Shanghai (CN); Yi Zhang, Shanghai (CN); Shiuh Luen Wang, San Jose, CA (US); Wen-Juei Lu, Cupertino, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/240,440

(22) PCT Filed: Aug. 8, 2012

(86) PCT No.: PCT/US2012/050022
§ 371 (c)(1),
(2), (4) Date: Apr. 16, 2014

(87) PCT Pub. No.: WO2013/028358
PCT Pub. Date: Feb. 28, 2013

(65) Prior Publication Data
US 2014/0217489 A1    Aug. 7, 2014

(30) Foreign Application Priority Data
Aug. 24, 2011    (CN) .......................... 2011 1 0247064

(51) Int. Cl.
*H01L 29/788*    (2006.01)
*H01L 21/28*    (2006.01)
(Continued)

(52) U.S. Cl.
CPC ........ *H01L 29/788* (2013.01); *H01L 21/28273* (2013.01); *H01L 27/11521* (2013.01); *H01L 29/42328* (2013.01); *H01L 29/66825* (2013.01); *H01L 29/66833* (2013.01)

(58) Field of Classification Search
CPC ............ H01L 29/788; H01L 21/28273; H01L 29/42328; H01L 29/66825; H01L 27/11521; H01L 29/66833
See application file for complete search history.

(56) References Cited

U.S. PATENT DOCUMENTS

| | | | |
|---|---|---|---|
| 6,525,369 B1 | 2/2003 | Wu | |
| 7,358,134 B2 | 4/2008 | Wu et al. | |
| 7,492,002 B2 | 2/2009 | Jeon et al. | |
| 8,008,702 B2 | 8/2011 | Wang et al. | |

(Continued)

FOREIGN PATENT DOCUMENTS

| | | | |
|---|---|---|---|
| CN | 1794458 A | 6/2006 | |
| JP | 05335588 | * 12/1993 | |

(Continued)

OTHER PUBLICATIONS

Search Report of R.O.C. Patent Application No. 101129722 dated Apr. 10, 2014.

(Continued)

*Primary Examiner* — Long Pham
(74) *Attorney, Agent, or Firm* — DLA Piper LLP (US)

(57) ABSTRACT

A non-volatile memory cell has a single crystalline substrate of a first conductivity type with a top surface. A first region of a second conductivity type is in the substrate along the top surface. A second region of the second conductivity type is in the substrate along the top surface, spaced apart from the first region. A channel region is the first region and the second region. A word line gate is positioned over a first portion of the channel region, immediately adjacent to the first region. The word line gate is spaced apart from the channel region by a first insulating layer. A floating gate is positioned over another portion of the channel region. The floating gate has a lower surface separated from the channel region by a second insulating layer, and an upper surface opposite the lower surface. The floating gate has a first side wall adjacent to but separated from the word line gate; and a second side wall opposite the first side wall. The second side wall and the upper surface form a sharp edge, with the second side wall greater in length than the first side wall. The upper surface slopes upward from the first side wall to the second side wall. A coupling gate is positioned over the upper surface of the floating gate and is insulated therefrom by a third insulating layer. An erase gate is positioned adjacent to the second side wall of the floating gate. The erase gate is positioned over the second region and insulated therefrom.

1 Claim, 5 Drawing Sheets

(51) Int. Cl.
  *H01L 29/423* (2006.01)
  *H01L 29/66* (2006.01)
  *H01L 27/115* (2006.01)

(56) References Cited

U.S. PATENT DOCUMENTS

| | | |
|---|---|---|
| 2003/0073275 A1 | 4/2003 | Kianian et al. |
| 2004/0065917 A1 | 4/2004 | Fan et al. |
| 2007/0093024 A1 | 4/2007 | Fu et al. |
| 2011/0076816 A1 | 3/2011 | Liu et al. |

FOREIGN PATENT DOCUMENTS

| | | |
|---|---|---|
| JP | 2006-093707 | 4/2006 |
| JP | 2009-044164 | 2/2009 |
| KR | 10-2004-0025241 | 3/2004 |

OTHER PUBLICATIONS

Chinese Office Action dated Sep. 30, 2014 corresponding to the related Chinese Patent Application No. 201110247064.8. (English and Chinese translations).

PCT Search Report mailed on Oct. 22, 2012 corresponding to the related PCT Patent Application No. US12/50022.

Japanese Office Action dated Feb. 25, 2015 corresponding to the related Japanese Patent Application No. 2014-527170. (English and Japanese translations).

Korean Notice of Preliminary Rejection dated Jan. 19, 2015 corresponding to the related Korean Patent Application No. 10-2014-7007040.

European Search Report dated Mar. 15, 2015 corresponding to the related European Patent Application No. 12826205.2.

* cited by examiner

METHOD OF MAKING A SPLIT GATE NON-VOLATILE FLOATING GATE MEMORY CELL HAVING A SEPARATE ERASE GATE, AND A MEMORY CELL MADE THEREBY

TECHNICAL FIELD

The present invention relates to a self-aligned method of making a non-volatile memory cell having a floating gate and a separate erase gate and more particularly wherein the floating gate has an enhanced edge to facilitate erase operation.

BACKGROUND OF THE INVENTION

Non-volatile memory cells having a floating gate for the storage of charges thereon are well known in the art. Referring to FIG. 1 there is shown a cross-sectional view of a non-volatile memory cell 10 of the prior art. The memory cell 10 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26. The erase gate 28 has a slight overhang over the floating gate 24. In the operation of the memory cell 10, charges stored on the floating gate 24 (or the absence of charges on the floating gate 24) control the flow of current between the first region 14 and the second region 16. Where the floating gate 24 has charges thereon, the floating gate 24 is programmed. Where the floating gate 24 does not have charges thereon, the floating gate 24 is erased. The memory cell 10 is fully disclosed in U.S. Pat. No. 7,868,375 and in U.S. Pat. No. 6,747,310 whose disclosures are incorporated herein in their entirety by reference.

The memory cell 10 operates as follows. During the programming operation, when charges are stored on the floating gate 24, a first positive voltage in the shape of a pulse is applied to the word line 20 causing the portion of the channel region 18 under the word line 20 to be conductive. A second positive voltage, also in the shape of a pulse, is applied to the coupling gate 26. A third positive voltage, also in the shape of a pulse, is applied to the erase gate 28. A voltage differential also in the shape of a pulse, is applied between the first region 14 and the second region 16. All of the first positive voltage, second positive voltage, third positive voltage and the voltage differential are applied substantially at the same time, and terminate substantially at the same time. The electrons from the first region 14 are attracted to the positive voltage at the second region 16. As they near the floating gate 24, they experience a sudden increase in the electric field caused by the voltage applied to the coupling gate 26 and the erase gate 28, causing the charges to be injected onto the floating gate 24. Thus, programming occurs through the mechanism of hot electron injection.

During the erase operation when charges are removed from the floating gate 24, a high positive voltage is applied to the erase gate 28. A ground voltage can be applied to the coupling gate 26 and/or the word line 20. Charges on the floating gate 24 are attracted to the erase gate 28 by tunneling through the insulating layer between the floating gate 24 and the erase gate 28. In particular, the floating gate 24 may be formed with a sharp tip facing the erase gate 28, thereby facilitating the Fowler-Nordheim tunneling of electrons from the floating gate 24 through the tip and through the insulating layer between the floating gate 24 and the erase gate 28 onto the erase gate 28. As disclosed in U.S. Pat. No. 7,868,375 and U.S. Pat. No. 6,747,310, it may be beneficial to have a sharp edge or tip between the side wall of the floating gate 24 and the top surface of the floating gate 24 so that electrons may more readily tunnel from the floating gate 24 to the erase gate 28 during the erase operation.

During the read operation, a first positive voltage is applied to the word line 20 to turn on the portion of the channel region 18 beneath the word line 20. A second positive voltage is applied to the coupling gate 26. A voltage differential is applied to the first region 14 and the second region 16. If the floating gate 24 were programmed, i.e. the floating gate 24 stores electrons, then the second positive voltage applied to the coupling gate 26 is not able to overcome the negative electrons stored on the floating gate 24 and the portion of the channel region 18 beneath the floating gate 24 remains non-conductive. Thus, no current or a minimal amount of current would flow between the first region 14 and the second region 16. However, if the floating gate 24 were not programmed, i.e. the floating gate 24 remains neutral or perhaps even stores some holes, then the second positive voltage applied to the coupling gate 26 is able to cause the portion of the channel region 18 beneath the floating gate 24 to be conductive. Thus, a current would flow between the first region 14 and the second region 16.

SUMMARY OF THE INVENTION

The present invention is a self-aligned method of fabricating a non-volatile memory cell having a single crystalline substrate of a first conductivity type with a top surface. A first region of a second conductivity type is in the substrate along the top surface. A second region of the second conductivity type is in the substrate along the top surface, spaced apart from the first region. A channel region is the first region and the second region. A word line gate is positioned over a first portion of the channel region, immediately adjacent to the first region. The word line gate is spaced apart from the channel region by a first insulating layer. A floating gate is positioned over another portion of the channel region. The floating gate has a lower surface separated from the channel region by a second insulating layer, and an upper surface opposite the lower surface. The floating gate has a first side wall adjacent to but separated from the word line gate; and a second side wall opposite the first side wall. The second side wall and the upper surface form a sharp edge, with the second side wall greater in length than the first side wall. The upper surface slopes upward from the first side wall to the second side wall. A coupling gate is positioned over the upper surface of the floating gate and is insulated therefrom by a third insulating layer. An erase gate is positioned adjacent to the second side wall of the floating gate. The erase gate is positioned over the second region and insulated therefrom.

The present invention also relates to the foregoing described memory cell.

DETAILED DESCRIPTION OF THE PREFERRED EMBODIMENT

Figure 1:
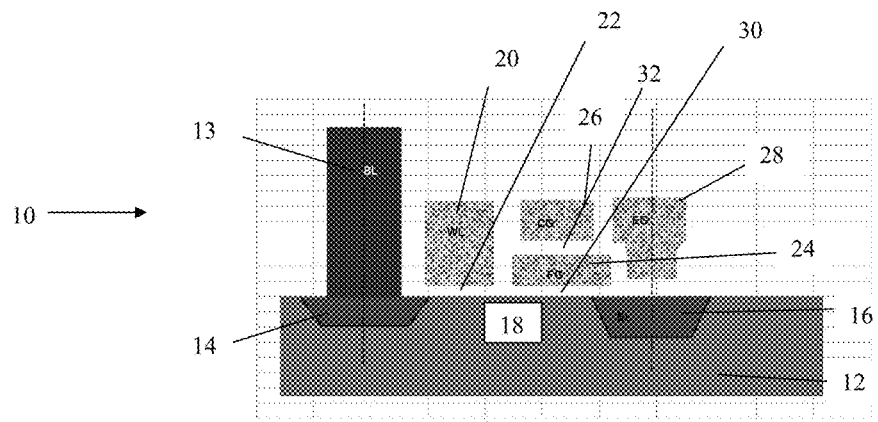
FIG. 1 is a cross-sectional view of a non-volatile memory cell of the prior art with a floating gate for the storage of charges thereon and a separate erase gate.
Figure 9:
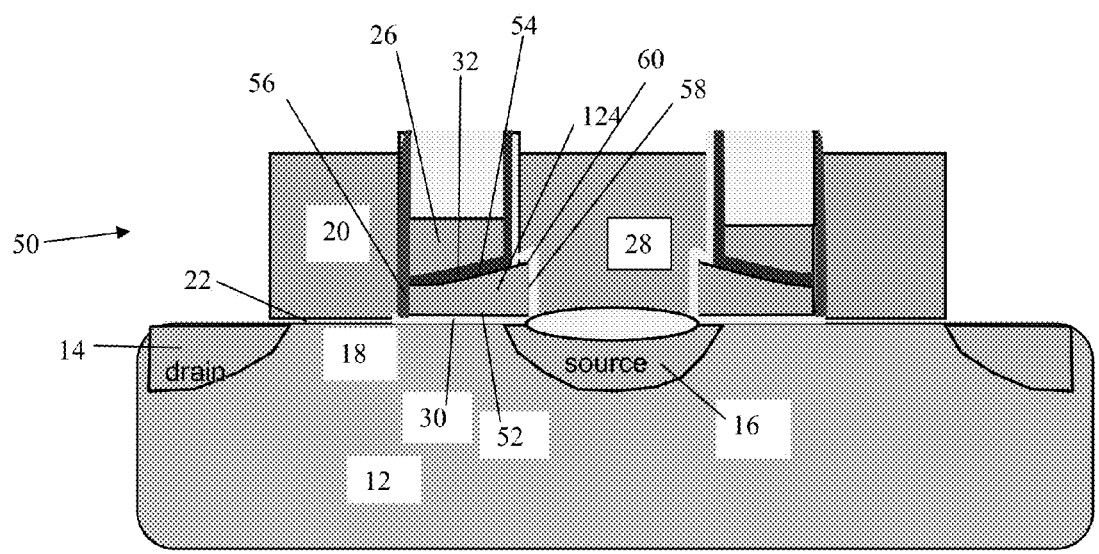
FIG. 9 is a cross-sectional view of a memory cell of the present invention.

Referring to FIG. 9 there is shown a cross-sectional view of a non-volatile memory cell 50 of the present invention. The memory cell 50 of the present invention is similar to the memory cell 10 shown in FIG. 1. Thus, like numerals will be used to describe like parts. The memory cell 50 comprises a single crystalline substrate 12, of a first conductivity type, such as P type. In the preferred embodiment, the conductivity of the substrate 12 is on the order of 10 S/m, where "S" is the inverse of resistivity, and "m" is meter. At or near a surface of the substrate 12 is a first region 14 of a second conductivity type, such as N type. In the preferred embodiment, the conductivity of the first region 14 is on the order of $10^5$ S/m. Spaced apart from the first region 14 is a second region 16 also of the second conductivity type, having substantially the same conductivity concentration as the first region 14. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 124, which is also made of polysilicon, and is positioned over another portion of the channel region 18. The floating gate 124 has a lower surface 52 that is separated from the channel region 18 by another insulating layer 30, typically also of silicon (di)oxide. The floating gate 124 also has an upper surface 54 opposite the lower surface 52. The floating gate 124 also has a first sidewall 56 which is adjacent to but separated from the word line gate 20. Opposite the first side wall 56 is a second side wall 58. The length of the first side wall 56 of the floating gate 124 is less than the length of the second side wall 58 of the floating gate 124. Thus, the upper surface 54 of the floating gate 124 slopes downward from the second side wall 58 to the first side wall 56. At the junction of the second side wall 58 and the upper surface 54 of the floating gate 124 is a sharp edge 60.

A coupling gate 26, also made of polysilicon is positioned over the upper surface 54 of the floating gate 124 and is insulated therefrom by another insulating layer 32. Adjacent to the second side wall 58 of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26. The erase gate 28 has a slight overhang over the floating gate 124.

The memory cell 50 of the present invention may be fabricated in accordance with the following process steps.

Although the following process steps are for the fabrication of the memory cell 50 for the 70 nm process, the invention is not so limited.

A single crystalline substrate 12 of P conductivity type is provided. The P conductivity has a concentration of $10^{15}/cm^3$. The substrate 12 has a top surface. A first insulating layer 30 of silicon (di)oxide is on the top surface of the substrate 12. The insulating layer 30 can be formed by oxidizing the structure in an oxide furnace and is formed to a thickness of the order of 30 Angstroms. A first layer of polysilicon 124 is formed on the insulating layer 30. The polysilicon layer 124 has a thickness of approximately 400 Angstroms. The polysilicon layer 124 can be formed by deposition of polysilicon. Thereafter, a hard mask layer, such as a layer of silicon nitride 70 is formed on the polysilicon layer 124. The silicon nitride 70 can be formed by depositing SiN. The hard mask 70 is patterned and etched, so that only portions of the silicon nitride 70 remain over selected regions of the polysilicon layer 124. The resultant structure is shown in FIG. 2.

Figure 2:
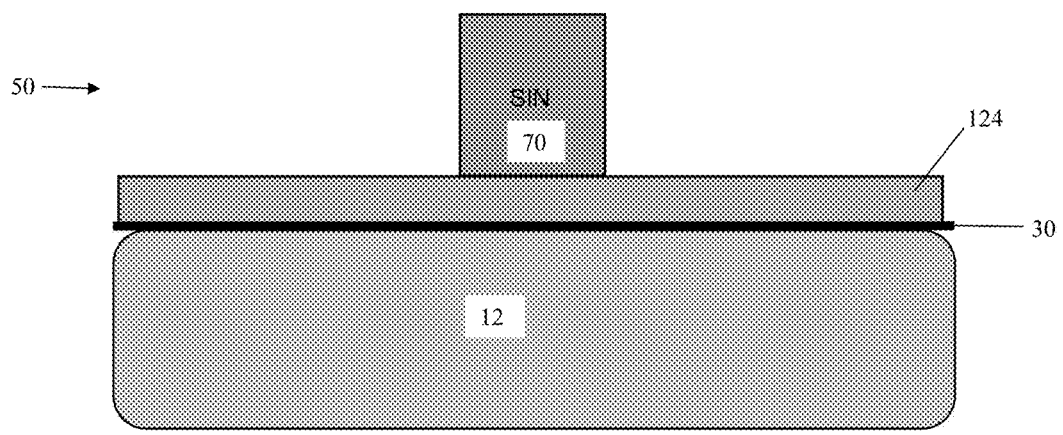
FIG. 2-8 are cross-sectional views of the process steps in the method of the present invention to fabricate the memory cell of the present invention.
Figure 3:
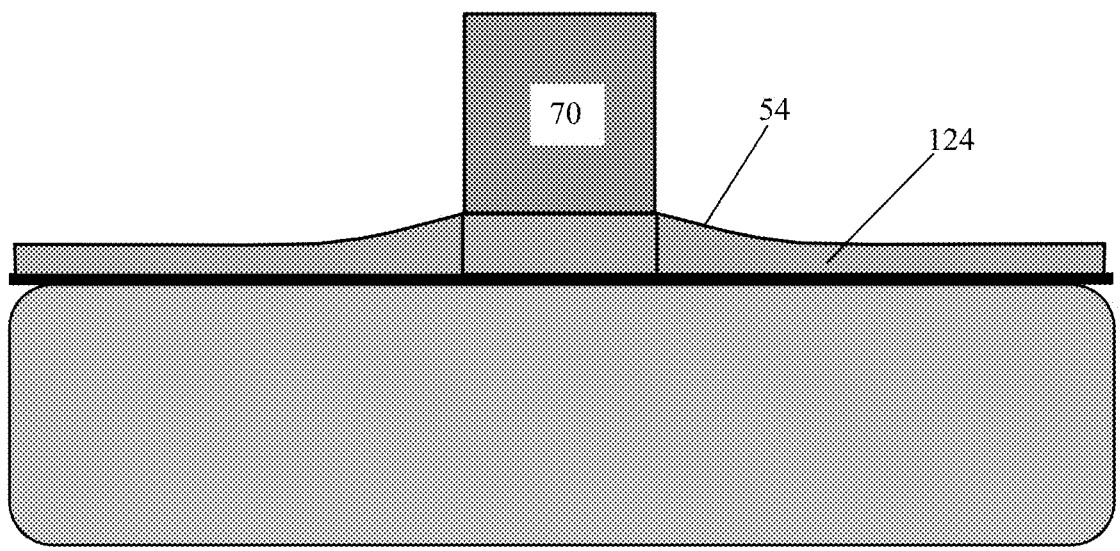

The structure shown in FIG. 2 with the exposed polysilicon layer 124 is then subject to an isotropic polysilicon etch process, resulting in the upper surface 54 of the polysilicon layer 124 sloping downward away from the SiN 70. In the preferred embodiment the isotropic etch process occurs using Chemical Dry Etch (CDE) (Shibaura CDE) at 250 W power and using CF4/O2/N2 for 15 seconds or Inductively Coupled Plasma (ICP) etch at 800 mTorr pressure and 150 W power using CF4/O2 for 15 seconds. Of course, these parameters may be varied to produce the desire sloping profile. Because the process is an isotropic etch, the polysilicon 124 closest to the SiN 70 is attacked the least amount, with the polysilicon 124 furthest away from the SiN being etched the most amount. This results in the sloping profile wherein the polysiclicon 124 is thickest closest to the SiN 70 and slopes downward and is thinnest furthest away from the SiN 70. The resultant structure is shown in FIG. 3.

A thin layer 72 (on the order of 150 Angstroms in thickness) of silicon (di)oxide is then deposited over the structure. This can be done by low pressure TEOS deposition. The silicon (di)oxide layer 72 of the structure is then anisotropically etched, resulting in spacers formed adjacent to the sides of the hard mask 70. The resultant structure is shown in FIG. 4.

Figure 4:
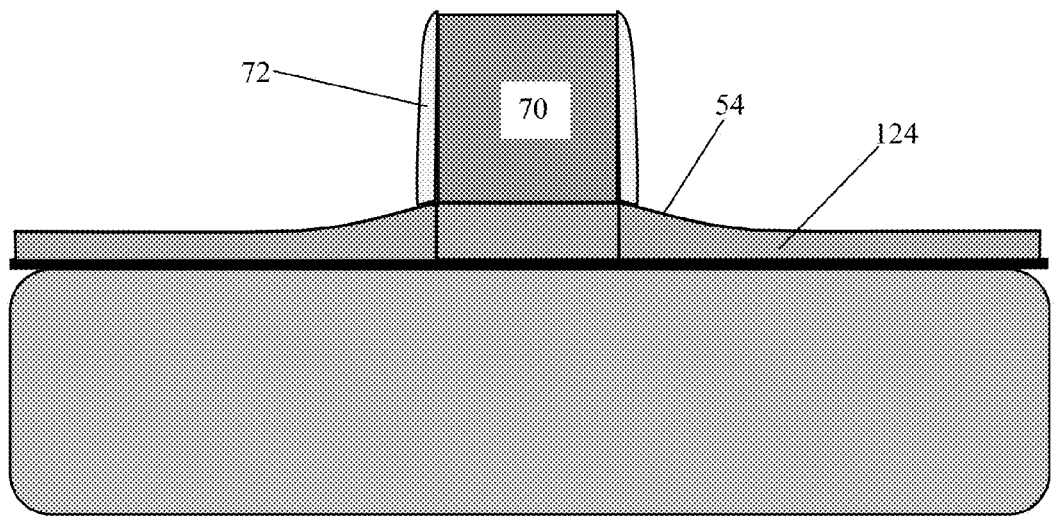

A composite layer 32 of insulating material is deposited on the structure shown in FIG. 4, and in particular over the first polysilicon 124. The composite layer 32 comprises silicon dioxide-silicon nitride-silicon dioxide or ONO. The composite layer 32 is formed by depositing the silicon dioxide in an HTO process, and then depositing SiN by a low pressure CVD SiN deposition process, followed by HTO oxidation process again to deposit another layer of silicon dioxide to form the ONO layer 32. The ONO layer 32 has a thickness on the order of 160 Angstroms. A second polysilicon layer 26 is then deposited on the ONO layer 32. The second polysilicon layer 26 has a thickness on the order of 2,000 Angstroms, and may be formed by CVD polysilicon deposition process. The second polysilicon layer 26 is then subject to a CMP (Chemical Mechanical Polishing) process such that the top of the second polysilicon layer 26 is "level" with the top of the SiN 70. The polysilicon 26 is then subject to an etchback process, so that the top of the polysilicon 26 is then below the top level of the SiN 70. The resultant structure is shown in FIG. 5.

Figure 5:
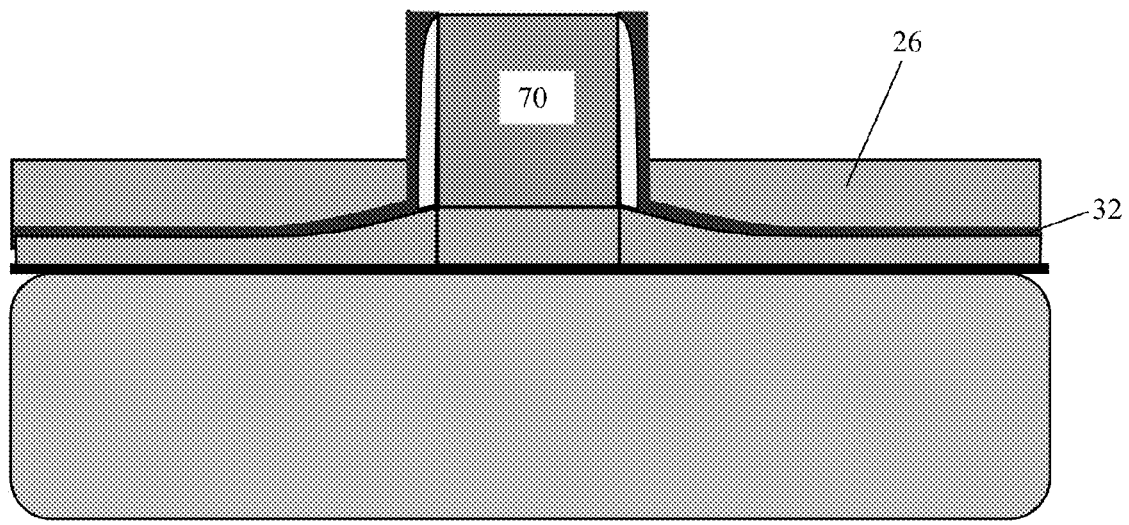

A silicon dioxide layer 80 is then deposited over the structure shown in FIG. 5. The process to form the layer 80 can be deposition by HTO process. The layer 80 is on the order of 1,000 Angstroms. The silicon dioxide layer 80 is then anisotropically etched resulting in spacers 80 formed adjacent to the ONO layer 32, along the side of the SiN 70. The resultant structure is shown in FIG. 6.

Figure 6:
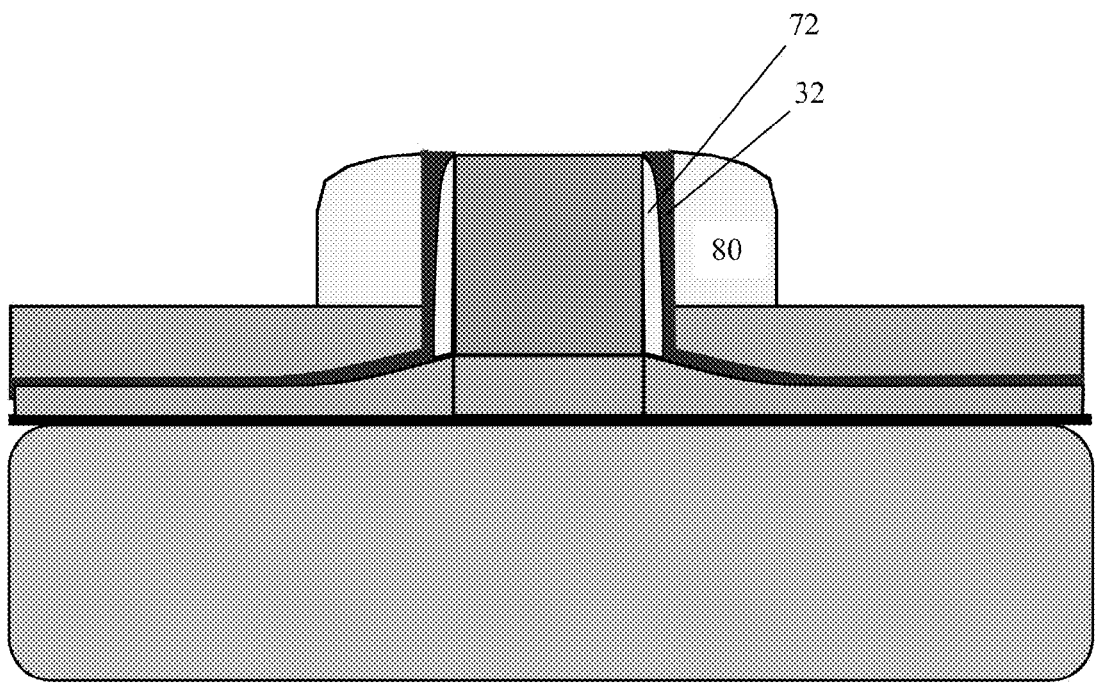
Figure 7:
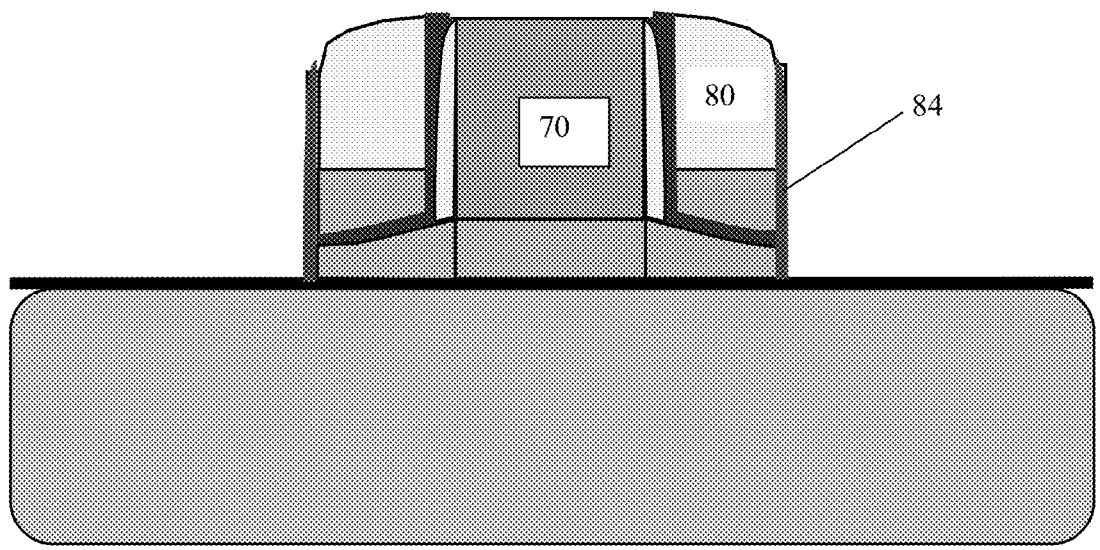

Using the spacers 80 as a mask, the structure shown in FIG. 6 is anistropically etched cutting the exposed second polysilicon layer 26, the insulating layer (ONO) 32 underneath the second polysilicon layer 26, the first polysicilicon layer 124 underneath the ONO 32, coming to a stop at the first insulating layer 30. Although the spacer 80 (silicon dioxide) is used as an etch stop, in the process of etching through the ONO layer 32, a slight portion of the spacer 80 will be etched as well. However, because the spacer 80 is relatively thick (on the order of 1,000 Angstroms), this slight etching of the spacer 80 is insignificant. The etching comes to a stop at the first insulating layer 30, which is another layer of silicon dioxide 30. A spacer 84 comprising of silicon dioxide is then formed on the structure. This can be done by depositing a layer of silicon dioxide followed by an anisotropic etch of the layer, coming to a stop when the SiN 70 is exposed, resulting in the spacers 84. The spacer 84 insulates the first polysilicon 124 (eventual floating gate) and the second polysilicon 26 (eventual coupling gate) from the to be formed adjacent word line gate. Of course any other type of insulating material or composite insulating material may also be used instead of silicon dioxide as the spacer 84. For example, the spacer 84 may be made of SiN/SiO2, which would require an additional masking step to remove the SiN hard mask The resultant structure is shown in FIG. 7.

Figure 8:
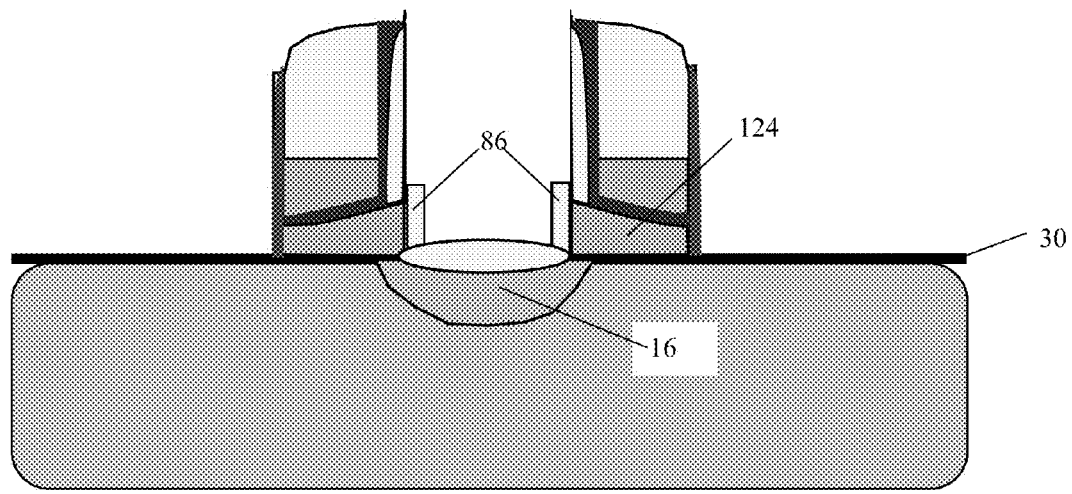

The SiN hard mask 70 is removed. This can be done by anisotropic dry etch of SiN, followed by a wet etch using H3PO4. Since all the rest of the structure shown in FIG. 7 is protected by silicon-dioxide, there is no etching of those structure. Thereafter, the exposed first polysilicon 124 is anisotropically etched until the first insulating layer 30 is reached. Thereafter, a masking step is performed covering all of the structure, except for the region where the SiN 70 was removed. An implant step is performed forming the second region 16. Following a slight silicon oxide wet etch, a thin layer of silicon dioxide 86 is formed by HTO oxidation of the structure, which oxidizes the exposed polysilicon 124. The resultant structure is shown in FIG. 8.

This is followed by a masking step covering only the regions where the SiN was located. This is followed by an etch of the exposed silicon dioxide 30, with an anisotropic etch. A thin silicon dioxide layer 22 is then grown by diffusion furnace to form over the channel region 18 which is spaced apart from the word line gate 20. Polysilicon is then the deposited everywhere including in the region where the SiN 70 was removed, as well as deposited adjacent to the spacer 84. Another masking step is formed opening location in the polysilion where the first region 14 would be formed in the substrate 12. Implant is made forming the first region 14 and doping the word line gate 20 and the erase gate 28. The resultant structure is shown in FIG. 9.

From the forgoing it can be seen that a self-aligned process of making a split gate non-volatile flash memory cell is shown. Further, the non-volatile flash memory cell is characterized by the floating gate having a sharp edge adjacent to the erase gate which enhances the erase operation.

What is claimed is:
1. A non-volatile memory cell comprising:
a single crystalline substrate of a first conductivity type having a top surface;
a first region of a second conductivity type in said substrate along the top surface;
a second region of the second conductivity type, in said substrate along the top surface, spaced apart from the first region;
a channel region between the first region and the second region;
a word line gate positioned over a first portion of the channel region, immediately adjacent to the first region, said word line gate spaced apart from the channel region by a first insulating layer;
a floating gate positioned over another portion of the channel region, said floating gate having a lower surface separated from the channel region by a second insulating layer, and an upper surface opposite the lower surface; said floating gate having a first side wall adjacent to but separated from the word line gate; and a second side wall opposite the first side wall, wherein said second side wall and said upper surface forming a sharp edge, with said second side wall greater in length than said first side wall and said upper surface having a curved shape that slopes upward from said first side wall to said second side wall;
a coupling gate positioned over the upper surface of the floating gate and insulated therefrom by a third insulating layer, wherein the coupling gate includes a first side wall adjacent to but separated from the word line gate and a second side wall opposite the first side wall of the coupling gate, and a lower surface that includes at least a portion that is disposed over the upward sloping upper surface of the floating gate and that slopes upward from the first side wall of the coupling gate to the second side wall of the coupling gate; and
an erase gate positioned adjacent to the second side wall of the floating gate; said erase gate positioned over the second region and insulated therefrom; said erase gate overhangs a portion of said floating gate.

* * * * *